(12) United States Patent
Anmadwar et al.

(10) Patent No.: US 11,476,817 B2
(45) Date of Patent: Oct. 18, 2022

(54) LOW-POWER AND AREA-EFFICIENT GAIN-BANDWIDTH TRIPLER AMPLIFIER

(71) Applicant: Intel Corporation, Santa Clara, CA (US)

(72) Inventors: Saurabh Anmadwar, Bengaluru (IN); Dheeraj Shetty, Bangalore (IN); Madhuban Kishor, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 17/023,192

(22) Filed: Sep. 16, 2020

(65) Prior Publication Data
US 2022/0085778 A1    Mar. 17, 2022

(51) Int. Cl.
*H03F 3/45* (2006.01)
*H03G 1/00* (2006.01)
*H03G 5/10* (2006.01)

(52) U.S. Cl.
CPC ....... *H03F 3/45695* (2013.01); *H03G 1/0023* (2013.01); *H03G 5/10* (2013.01); *H03H 2210/015* (2013.01)

(58) Field of Classification Search
CPC .... H03F 3/45695; H03G 1/0023; H03G 5/10; H03H 2210/015
USPC .................................................. 330/252–261
See application file for complete search history.

(56) References Cited

U.S. PATENT DOCUMENTS

| 6,484,041 B1* | 11/2002 | Aho ...................... G06F 1/3296 455/343.1 |
| 9,369,091 B2* | 6/2016 | Horng ...................... H03F 3/193 |
| 2013/0063210 A1* | 3/2013 | Corsi ...................... H03F 1/223 330/261 |

* cited by examiner

*Primary Examiner* — Khanh V Nguyen
*Assistant Examiner* — Khiem D Nguyen
(74) *Attorney, Agent, or Firm* — Schwabe, Williamson & Wyatt, P.C.

(57) ABSTRACT

An active current source load of a fully differential amplifier which is converted into a transconductance ($g_m$) component also at higher frequency by feed-forwarding input signals to their gates. With signal coupling to gate, unity gain bandwidth (UGB) of the amplifier increases by a factor of two. In addition to this, the signal is coupled to source as well to achieve three-fold UGB enhancement. Thus, the effective trans-conductance is $g_{mp}$ at dc and becomes $g_{mp}+(g_{mn_{gate}}+g_{mn_{src}})$ at high frequency which triples the UGB when $g_{mp}=g_{mn_{gate/src}}$.

18 Claims, 6 Drawing Sheets

LOW-POWER AND AREA-EFFICIENT GAIN-BANDWIDTH TRIPLER AMPLIFIER

BACKGROUND

Achieving higher gain-bandwidth-product (GBW) for an amplifier with minimal area impact without burning any extra power is challenging. One way to increase GBW is to increase bias current in a single amplifier stage. However, increasing the bias current increases power. Another way to increase GBW is to cascade a number of stages with lesser gain per stage. However, increasing the number of stages results in proportional increase in power and area. Another way to increase GBW is to apply broadband peaking techniques. However, using broadband peaking techniques results in huge area impact due to its dependency on passive inductor. Also, peaking response is process corner sensitive. Another way to increase GBW with lesser area is to use active inductor load which typically needs additional voltage headroom. There are low-headroom versions of active inductor load but their implementation needs extra current to implement level shifting. Again, peaking response is process corner sensitive and requires tuning. The increase in 3 dB bandwidth is less than 1.5× in the above case, however.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Some embodiments describe an active current source load of a fully differential amplifier which is converted into a transconductance ($g_m$) component also at higher frequency by feed-forwarding input signals to their gates. With signal coupling to gate, unity gain bandwidth (UGB) of the amplifier increases by a factor of two. In addition to this, the signal is coupled to a source terminal as well to achieve three-fold UGB enhancement. Thus, the effective trans-conductance is $g_{mp}$ at DC and becomes $g_{mp}+(g_{mn_{gate}}+g_{mn_{src}})$ at high frequency which triples the UGB when $g_{mp}=g_{mn_{gate/src}}$. The amplifier of various embodiments enhances existing voltage-gain amplifiers used in I/O receivers by providing higher gain with less power and area compared to traditional voltage-gain amplifiers.

There are many technical effects of the various embodiments. For example, the proposed idea enhances the gain-bandwidth product of an amplifier without any additional power. Higher GBW product avoids cascading of multiple low gain, high bandwidth voltage-gain amplifier (VGA) stages, which otherwise consumes power and area with addition of each stage. The output being a higher impedance node at DC as compared to active inductor requires less current in offset calibration branch as well. Also, the theoretical maximum boost this stage can offer is higher (e.g., 9.5 dB) than traditional amplifiers which helps in cancelling inter-symbol-interference (ISI) caused by a channel. Moreover, tuning of peak is comparatively much simpler as compared to peaking techniques mentioned previously since boost is ideally a ratio of trans-conductances of metal oxide semiconductor field effect transistors (MOSFETs). Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 1:
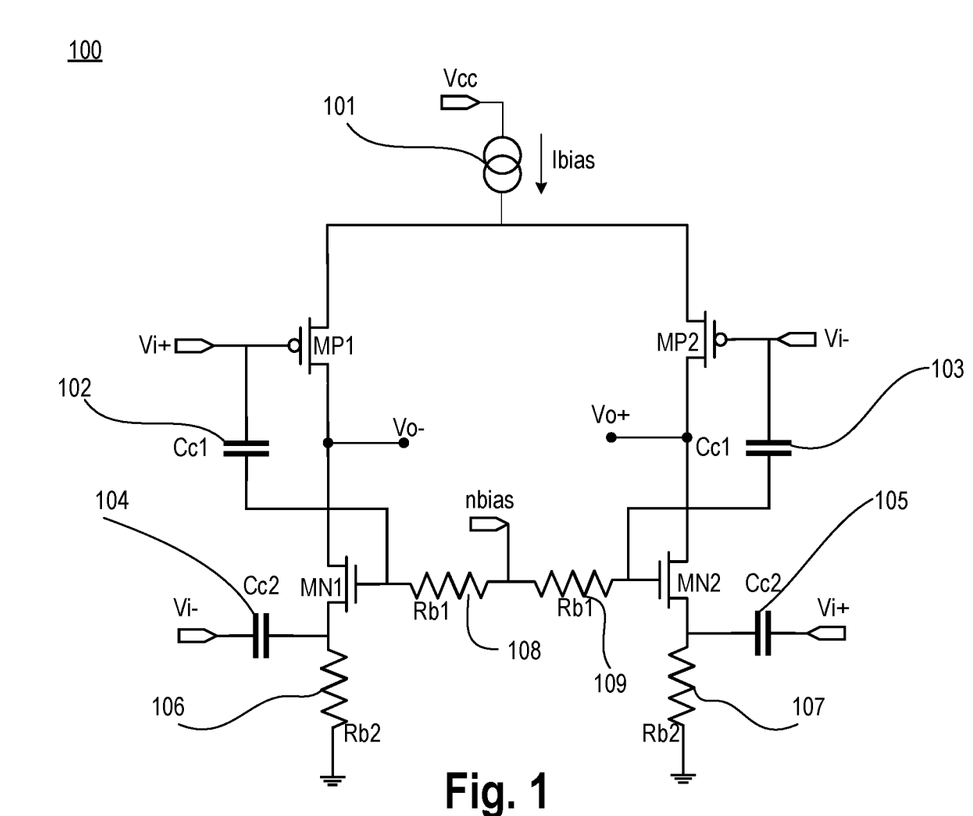
FIG. 1 illustrates a differential p-type input gain-bandwidth product tripler amplifier, in accordance with some embodiments.

FIG. 1 illustrates a differential p-type input gain-bandwidth product tripler amplifier 100, in accordance with some embodiments. In some embodiments, amplifier 100 comprises current source 101 (to provide Ibias) p-type transistors MP1 and MP2, n-type transistors MN1 and MN2, first set of capacitors $C_{c1}$ 102 and 103, second set of capacitors $C_{c2}$ 104 and 105, and set of resistive devices $R_{b1}$ and $R_{b2}$ (e.g., first set of resistive devices $R_{b2}$ 106 and 107, and second set of resistive devices $R_{b1}$ 108 and 109). Current source 101 is coupled to power supply node Vcc, and to input p-type transistors MP1 and MP2. N-bias is provided to resistive devices 108 and 109. Input Vi+ controls the gate of MP1 and is coupled to the gate of MN1 via capacitor $C_{c1}$ 102. Input Vi− controls the gate of MP2 and is coupled to the gate of MN2 via capacitor $C_{c1}$ 103. Input Vi+ is coupled to the source of transistor MN2 through a capacitor $C_{c2}$ 105. Input Vi− is coupled the source of transistor MN1 through the capacitor $C_{c2}$ 104.

In some embodiments, the differential amplifier (e.g., an apparatus) comprises: a first input (Vi+) and a second input (Vi−) and a first transconductance component (e.g., MN1) and a second transconductance component (e.g., MN2). In some embodiments, the differential amplifier comprises a first feedforward path where the first input is coupled to a gate of the first transconductance component. The first feedforward path includes the first input Vi+, capacitor 102, and gate of transistor MN1. In some embodiments, the differential amplifier comprises a second feedforward path where the second input is coupled to a gate of the second transconductance component. The second feedforward path includes the second input Vi+, capacitor 103, and gate of transistor MN2.

In some embodiments, the differential amplifier comprises: a first capacitor 104 coupled to the second input Vi− and a source of the first transconductance component (MN1); and a second capacitor 105 coupled to the first input Vi+ and a source of the second transconductance component (MN2). In some embodiments, the first feedforward path comprises a third capacitor 102 with a first terminal coupled to the gate of the first transconductance component MN1 and a second terminal coupled to the first input Vi+. In some embodiments, the second feedforward path comprises a fourth capacitor 103 with a first terminal coupled to the gate of the second transconductance component MN2 and a second terminal coupled to the second input Vi−.

In some embodiments, the differential amplifier comprises a first input transistor MP1 to receive the first input Vi+, wherein the first input transistor MP1 is coupled in series with the first transconductance component MN1. In some embodiments, the differential amplifier comprises a second input transistor MP2 to receive the second input Vi−, wherein the second input transistor MP2 is coupled in series with the second transconductance component MN2. In some embodiments, the differential amplifier comprises a current source 101, wherein the first input transistor MP1 and the second input transistor MP2 are coupled to current source 101. In some embodiments, the first transconductance component comprises a first n-type transistor MN1, wherein the second transconductance component comprises a second n-type transistor MN2.

In some embodiments, the differential amplifier comprises a first resistive device 108 coupled to the gate of the first transconductance component MN1; and a second resistive device 109 coupled to the gate of the second transconductance component MN2, wherein first resistive device 108 is coupled in series with second resistive device 109. In some embodiments, first resistive device 108 and second resistive device 109 are coupled to a node, wherein the node is coupled to a bias (nbias). In some embodiments, the differential amplifier comprises a third resistive device 106 coupled to a source of the first transconductance component MN1; and a fourth resistive device 107 coupled to a source of the second transconductance component MN2.

In various embodiments, the capacitors (e.g., $C_{c1}$ and $C_{c2}$) are implemented as discrete capacitors, transistors configured as capacitors, metal-insulator-metal (MIM) capacitors, ferroelectric capacitors, metal capacitors, or a combination of them. The capacitance of capacitors 102, 103, 104, and 105 are in a range of 75 fF to 150 fF depending on the frequency of operation. However, other values for capacitances can be used depending on the design requirements. In some embodiments, resistors $R_{b1}$ and $R_{b2}$ are discrete resistors offered by a process technology node, transistors configured as resistors, transistors biased with an analog bias voltage, or a combination of them. The resistance of resistors 106, 107, 108, and 109 are in a range of 1 kOhms to 2 kOhms. However, other values for resistances can be used depending on the design requirements.

In some embodiments, differential amplifier 100 acts as a standard differential amplifier at low frequency with input p-type differential pair (MP1 and MP2) as gain component (i.e., trans-conductance) and the bias n-type (MN1 and MN2) are as the active current-source load. In some embodiments, at low frequency, the capacitors $C_{c1}$ and $C_{c2}$ are open and gain ($A_{dc}$) is $g_{mp1,2} * Z_{load}$ (where, $Z_{load}$ is the output impedance of amplifier). At high frequency ($>=F_e$), capacitors $C_c$ (e.g., $C_{c1}$ and $C_{c2}$) feed-forwards the inputs (Vi+ and Vi−) to the gate as well as to the source of the respective n-type active current-source load (e.g., MN1 and MN2) for relatively high value of $R_b$. In various embodiments, the n-type trans-conductance from gate ($g_{mn1,2_{gate}}$) of MN1 and MN2 and from source ($g_{mn1,2_{src}}$) of MN1 and MN2 adds to that of the input pair $g_{mp1,2}$, thus increasing the peak gain $A_{ac} = (g_{mp1,2} + g_{mn1,2_{gate}} + g_{mn1,2_{src}}) * Z_{load}$ by superposition principle. Note, the actual peak gain is a function of the bias current, the load capacitor and cutoff frequency ($F_z$).

This effective peaking of the total trans-conductance ($G_m$) can be used to obtain boost to help cancel ISI (inter-symbol interference) caused by channel Following is the transfer function H(s), $$H(s) = G_m * Z_{load} = G_m * \frac{R_{load}}{sR_{load}C_{load} + 1} \quad (1)$$

$$G_m = \left[ g_{mp1,2} + g_{mn1,2_{gate}} \left( \frac{sR_{b1}C_{c1}}{sR_{b1}C_{c1} + 1} \right) + g_{mn1,2_{src}} \left( \frac{sR_{b2}C_{c2}}{sR_{b2}C_{c2} + 1 + g_{mn1,2,src} + R_{b2}} \right) \right] \quad (2)$$

The extra factor $g_{mn1,2,src} * R_{b2}$ in the denominator of the third expression comes because the source of a MOSFET is not high impedance unlike that of the gate. For, $$g_{mp1,2} = g_{mn1,2} = g_{mp,n}, R_{b1} = R_{b2} = R_b \quad (3)$$

and $C_{c1} = C_{c2} = C_c$, $$H(s) = \frac{g_{mp,n} * R_{load}}{sR_{load}C_{load} + 1} \left[ 1 + \frac{sR_bC_c}{sR_bC_c + 1} + \frac{sR_bC_c}{sR_bC_c + 1 + g_{mn1,2} * R_b} \right]$$

At unity gain frequency, real part of poles and zeroes are negligible with respect to the corresponding imaginary parts. So, with |H(s)|=1, the expression of equation (3) simplifies to give UGB as follows:

$$UGB = 3 \frac{g_{mp,n}}{C_{load}} \quad (4)$$

While various embodiments use the transconductance of MN1 and MN2, which are referred to as transconductance components, input devices MP1 and MP2 are also transconductance components.

Figure 2:
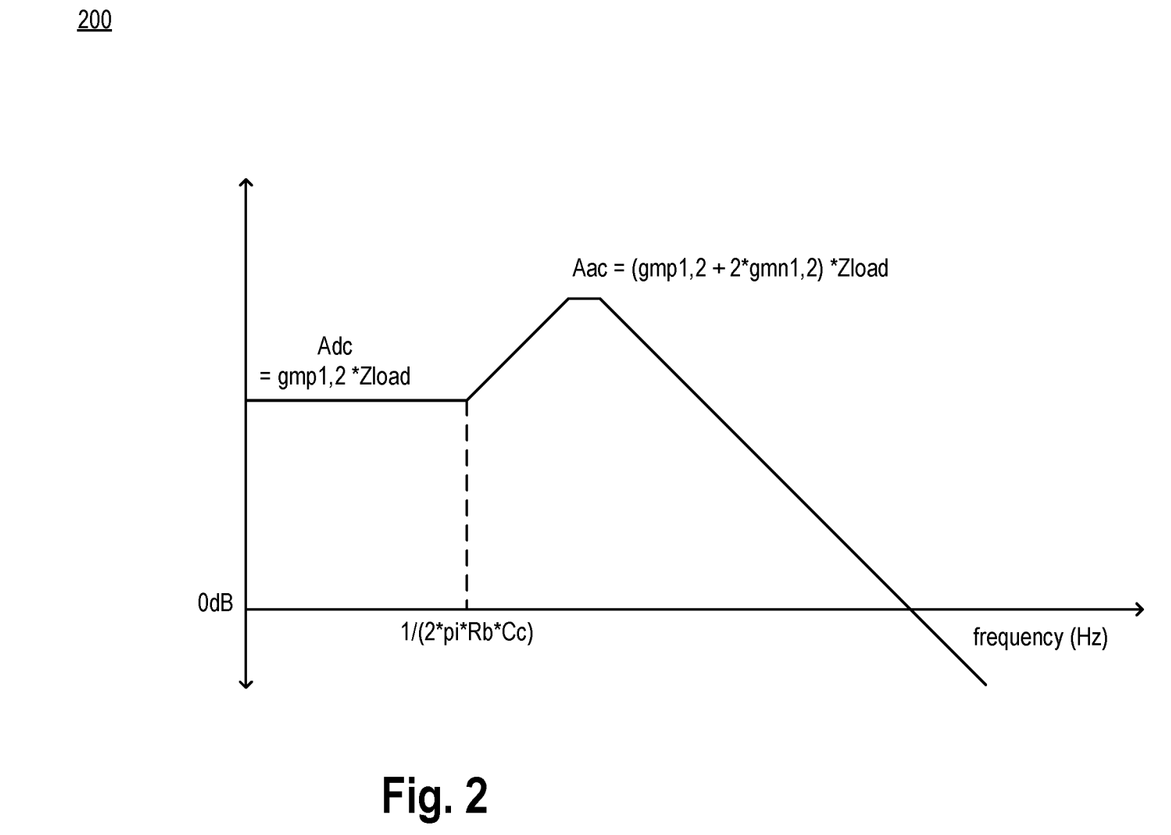
FIG. 2 illustrates a plot showing gain of the amplifier, in accordance with some embodiments.

FIG. 2 illustrates plot 200 showing gain of the amplifier, in accordance with some embodiments. As shown in plot 200, the maximum theoretical boost achievable $$20 * \log_{10} \frac{g_{mp1,2} + 2 * g_{mn1,2}}{g_{mp1,2}} = 9.5 \text{ dB (when } g_{mp1,2} = g_{mn1,2}).$$

The boost can be adjusted by tuning the resistor $R_b$ from 0 dB to its maximum value. Practically, the bandwidth enhancement factor and maximum boost that can be achieved depending on the ratio of coupling capacitor ($C_{c1}$ or $C_{c2}$) to the parasitic capacitances at the gate and source of the current source load device MN1 (or MN2).

In some embodiments, the value of capacitances of capacitors ($C_{c1}$ or $C_u$) used to overcome attenuation due to these parasitic capacitances can be less than 100 fF, which can be implemented in area of the order of few 10s of um². Whereas, a typical inductor with decent Q-factor will be of the order of several 100s of um². Hence, even with 4 such coupling capacitors (102, 103, 104, and 105), the area occupied is far lesser than that of an inductor-based technique.

Simulation results of a small signal gain of the amplifier of various embodiments in dB show bandwidth extension. In one example, compared to prior art amplifier, UGB enhances by approximately 2.8× (=28.5 GHz/10.6 GHz) and hence the GBW.

While FIG. 1 illustrates a differential input gain-bandwidth product tripler amplifier, the design concepts are applicable to single-ended amplifier. Further, the design can be implemented for both p-type and n-type input transistors.

Figure 3:
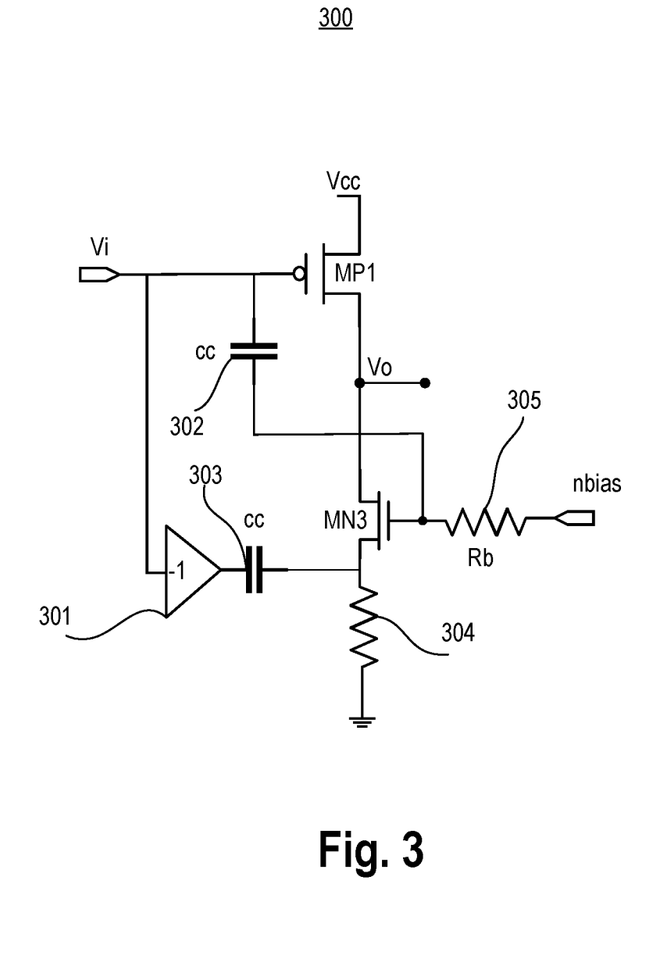
FIG. 3 illustrates a single-ended p-type input gain-bandwidth product tripler amplifier, in accordance with some embodiments.

FIG. 3 illustrates single-ended p-type input gain-bandwidth product tripler amplifier 300, in accordance with some embodiments Amplifier 300 comprises p-type input transistor MP1, n-type transistor MN3, inverting amplifier 301, coupling capacitors Cc 302 and 303, and resistor Rb 305 coupled as shown. Transistor MP1 receives input Vi. Transistor MP1 is coupled to supply node Vcc. In some embodiments, inverting amplifier 301 (e.g., inverter) has an input coupled to Vi and an output coupled to capacitor Cc 303. Capacitor Cc 303 is coupled to the source of n-type transistor MN3 and resistor 304. In some embodiments, the gate of MN3 is coupled to the gate of MP1 via capacitor Cc 302. A resistor Rb 305 biases MN3 using nbias. Any suitable source can be used to generate nbias (e.g., bandgap circuit, voltage divider, resistor divider, etc.) or a common-mode feedback can automatically generate this nbias.

Net transconductance ($G_m$) at high frequencies comprises of three components. The first component is the DC transconductance from the input pair (MP1). The second component comes from transistor MN3 since the input signal is AC coupled to its gate. The third component of ($G_m$) comes from the source of the same n-type transistor MN3 and uses an out of phase version of the input signal since the signal at the source and gate of a MOSFET gets subtracted to produce the incremental current in the amplifier. For a case, where all these three components are equal, the net transconductance ($G_m$) is three times of the DC transconductance from MP1.

Figure 4:
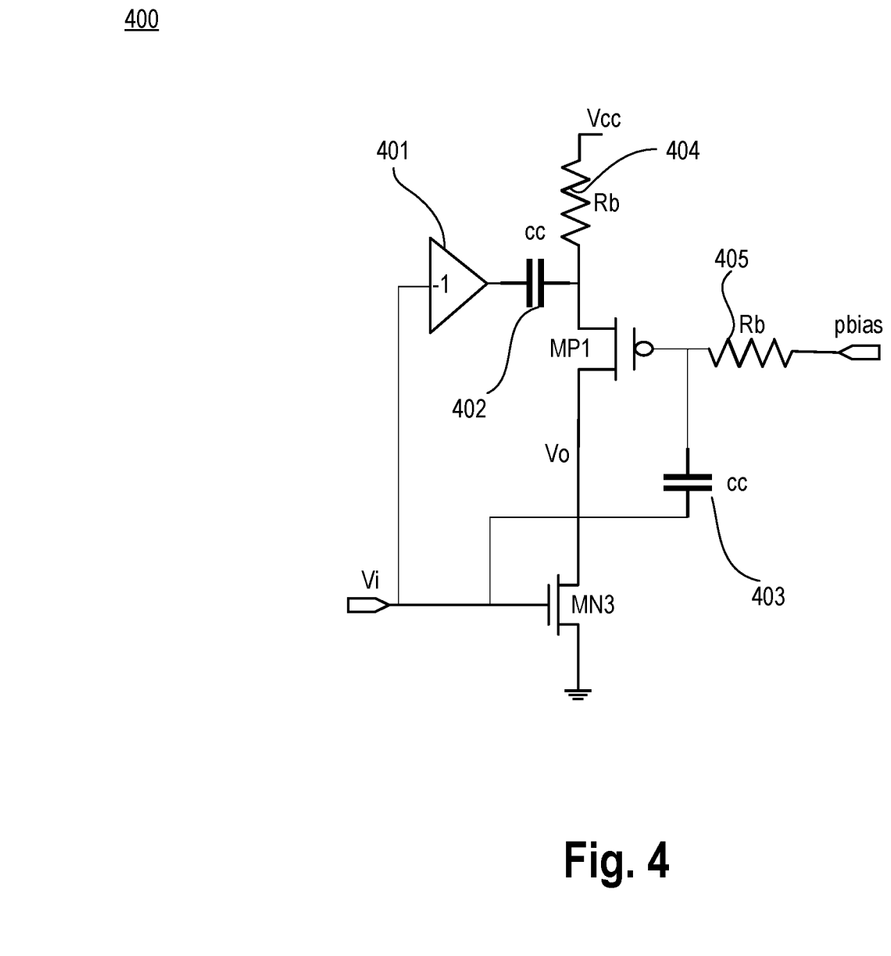
FIG. 4 illustrates a single-ended n-type input gain-bandwidth product tripler amplifier, in accordance with some embodiments.

FIG. 4 illustrates single-ended n-type input gain-bandwidth product tripler amplifier 400, in accordance with some embodiments Amplifier 400 comprises n-type input transistor MN3, p-type transistor MP1, inverting amplifier 401, coupling capacitors Cc 402 and 403, and resistor Rb 405 coupled as shown. Transistor MN3 receives the input Vi.

Transistor MN3 is coupled to supply node Vss (ground). Inverting amplifier 401 (e.g., inverter) has an input coupled to Vi and an output coupled to capacitor Cc 402. Capacitor Cc 402 is coupled to the source of p-type transistor MP1 and resistor 404. In some embodiments, the gate of transistor MN3 is coupled to the gate of transistor MP1 via coupling capacitor Cc 403. A resistor Rb 405 biases transistor MP1 using pbias. Any suitable source can be used to generate pbias (e.g., bandgap circuit, voltage divider, resistor divider, etc.) or a common-mode feedback can automatically generate this pbias.

The net transconductance ($G_m$) at high frequencies comprises of three components. The first component is the DC transconductance from input pair (MN1). The second component comes from the p-type MP1 since the input signal is AC coupled to its gate. The third component of ($G_m$) comes from the source of the same PMOS MP1 but uses an out of phase version of input signal since signal at source and gate of a MOSFET gets subtracted to produce the incremental current in the amplifier. For a case where all these three components are equal, net transconductance ($G_m$) is three times of the DC transconductance from MP1.

Figure 5:
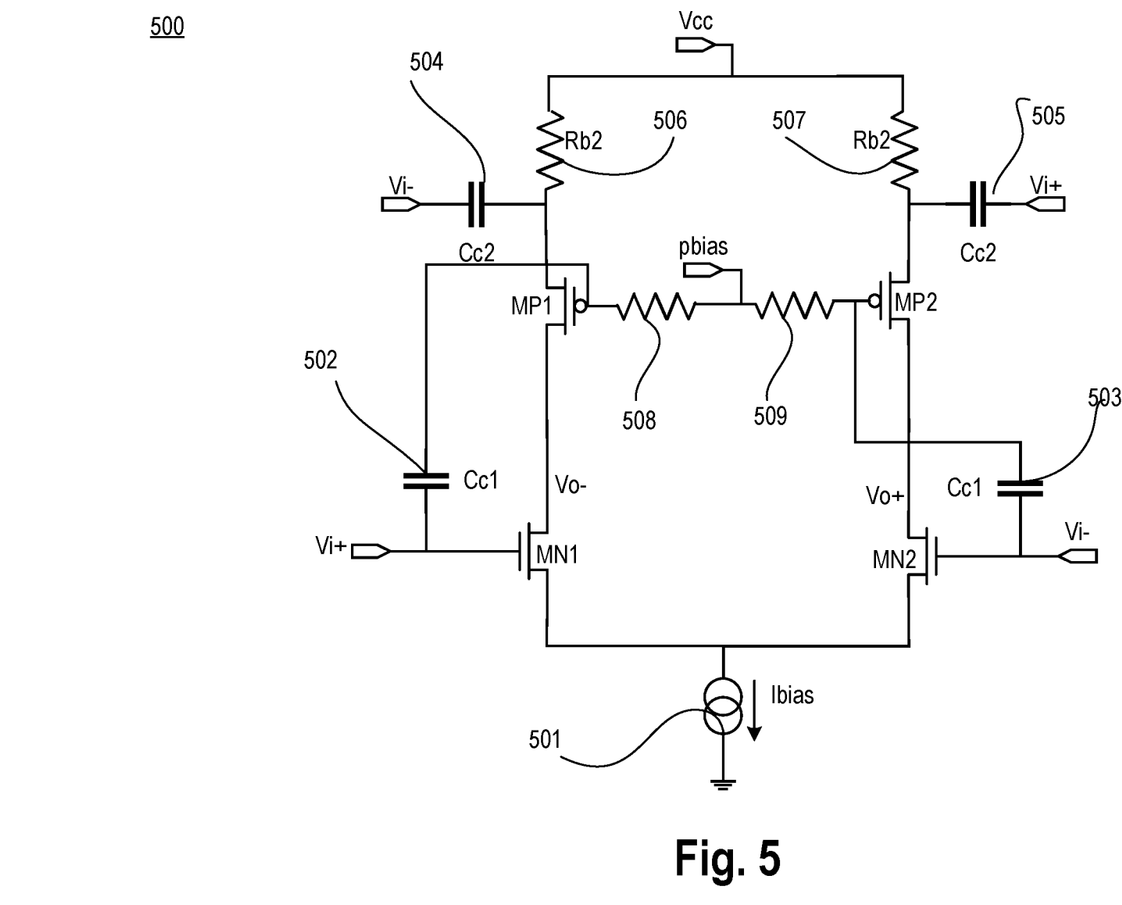
FIG. 5 illustrates a differential n-type input gain-bandwidth product tripler amplifier, in accordance with some embodiments.

FIG. 5 illustrates differential n-type input gain-bandwidth product tripler amplifier 500, in accordance with some embodiments Amplifier 500 is similar to amplifier 100 but is flipped to accommodate an n-type current source and n-type input transistors. In some embodiments, amplifier 500 comprises current source 501 (to provide Ibias) n-type transistors MN1 and MN2, p-type transistors MP1 and MP2, first set of capacitors $C_{c1}$ 502 and 503, second set of capacitors $C_{c2}$ 504 and 505, first set of resistive devices $R_{b2}$ 506 and 507, and second set of resistive devices $R_{b1}$ 508 and 509. Current source 501 is coupled to ground supply node Vss, and to input n-type transistors MN1 and MN2. P-bias is provided to resistive devices 508 and 509. Input Vi+ controls the gate of transistor MN1 and is coupled to the gate of transistor MP1 via capacitor $C_{c1}$ 502. Input Vi− controls the gate of transistor MN2 and is coupled to the gate of transistor MP2 via capacitor $C_{c1}$ 503. Input Vi+ is coupled to capacitor $C_{c2}$ 504 which in turn is coupled to a source of transistor MP1. Input Vi− is coupled to capacitor $C_{c2}$ 505 which in turn is coupled to a source of transistor MP2. In various embodiments, the coupling capacitors (e.g., $C_{c1}$ and $C_{c2}$) are implemented as discrete capacitors, transistors configured as capacitors, metal-insulator-metal (MIM) capacitors, ferroelectric capacitors, metal capacitors, or a combination of them. In some embodiments, resistors $R_{b1}$ and $R_{b2}$ are discrete resistors offered by a process technology node, transistors configured as resistors, transistors biased with an analog bias voltage, or a combination of them. Operation wise, amplifier 500 operates similar to amplifier 100.

Figure 6:
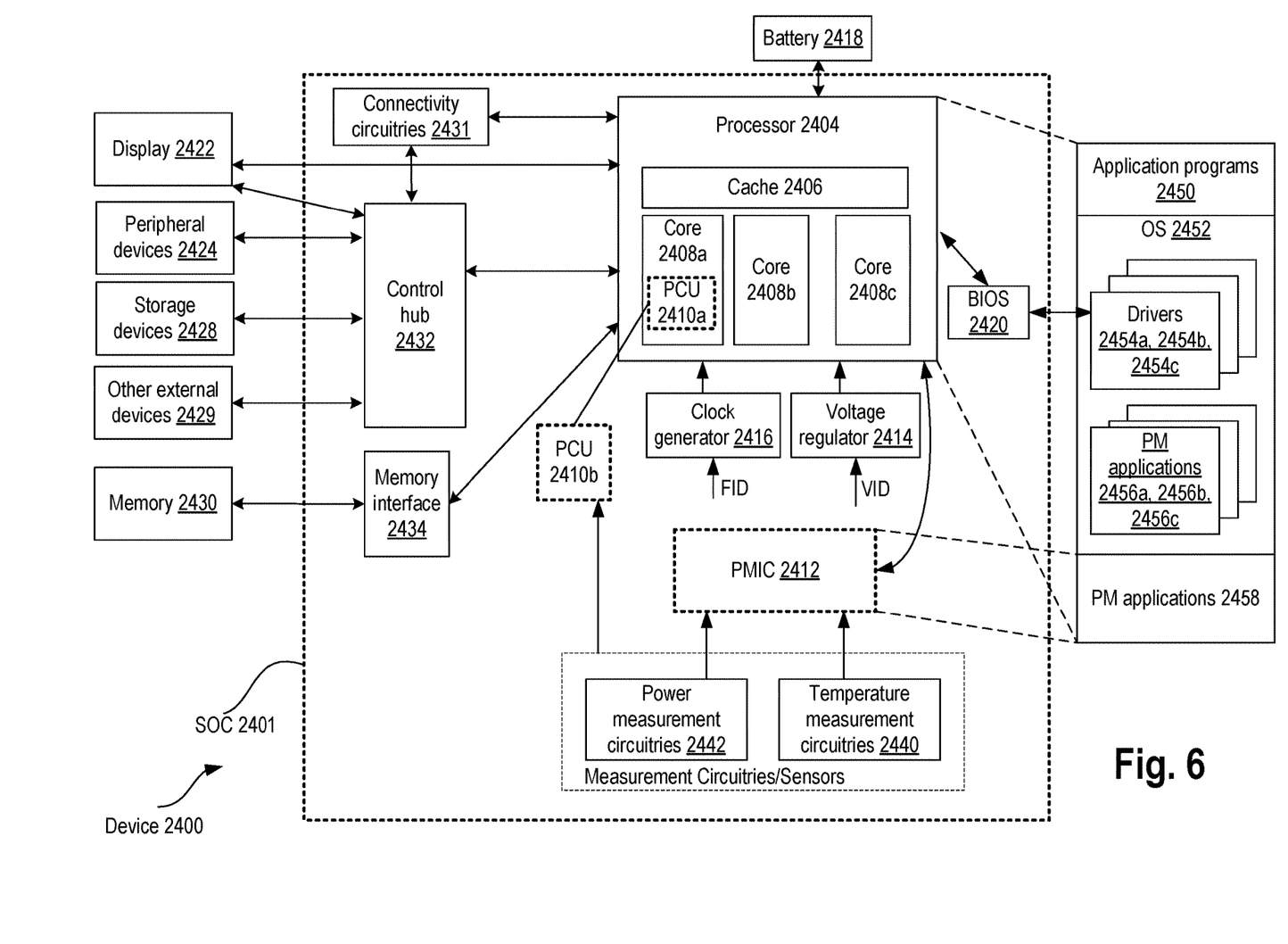
FIG. 6 illustrates a smart device or a computer system or a SoC (System-on-Chip) with one or more gain-bandwidth product tripler amplifiers (single-ended or differential), in accordance with some embodiments.

FIG. 6 illustrates a smart device or a computer system or a SoC (System-on-Chip) with one or more gain-bandwidth product tripler amplifiers (single-ended or differential), in accordance with some embodiments. In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400. Any of the blocks here can include the gain-bandwidth product tripler amplifier (single-ended or differential). For example, in serial-de-serializers, the VGA can be implemented using the gain-bandwidth product tripler amplifier (single-ended or differential). The gain-bandwidth product tripler amplifier when used as a VGA, lower current is used in offset calibration branch and can work with lower voltage headroom on load unlike the active inductor load. Boost is controlled by programming resistor $R_b$, whereas, the gain is controlled by separate shunt resistor between differential outputs of the VGA. The gain-bandwidth product tripler amplifier can be used as analog front-end (AFE) in high-speed links where pad impedance is −50 Ohm or can also be used post-CTLE (continuous time linear equalization) stage.

In an example, the device 2400 comprises an SoC (System-on-Chip) 2401. An example boundary of the SoC 2401 is illustrated using dotted lines in FIG. 6, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 6, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410*a/b* and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, VR 2414 includes a separate self-start controller, which is functional without fuse and/or trim information. The self-start controller protects VR 2414 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 2414 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410*a/b* has a capability to enable extra compute and telemetries resources for the runtime support of the pCode. Here pCode refers to a firmware executed by PCU 2410*a/b* to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SoC 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

In some embodiments, VR 2414 includes a current sensor to sense and/or measure current through a high-side switch of VR 2414. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1

An apparatus comprising: a first input and a second input; a first transconductance component and a second transconductance component; a first feedforward path where the first input is coupled to a gate of the first transconductance component; a second feedforward path where the second input is coupled to a gate of the second transconductance component; a first capacitor coupled to the second input and a source of the first transconductance component; and a second capacitor coupled to the first input and a source of the second transconductance component.

Example 2

The apparatus of example 1, wherein the first feedforward path comprises a third capacitor with a first terminal coupled to the gate of the first transconductance component and a second terminal coupled to the first input.

Example 3

The apparatus of example 1, wherein the second feedforward path comprises a fourth capacitor with a first terminal coupled to the gate of the second transconductance component and a second terminal coupled to the second input.

Example 4

The apparatus of example 1 comprising: a first input transistor to receive the first input, wherein the first input transistor is coupled in series with the first transconductance component; and a second input transistor to receive the second input, wherein the second input transistor is coupled in series with the second transconductance component.

Example 5

The apparatus of example 4 comprising a current source, wherein the first input transistor and the second input transistor are coupled to the current source.

Example 6

The apparatus of example 1, wherein the first transconductance component comprises a first n-type transistor, and wherein the second transconductance component comprises a second n-type transistor.

Example 7

The apparatus of example 1 comprises: a first resistive device coupled to the gate of the first transconductance component; and a second resistive device coupled to the gate of the second transconductance component, wherein the first resistive device is coupled in series with the second resistive device.

Example 8

The apparatus of example 7, wherein the first resistive device and the second resistive device are coupled to a node, wherein the node is coupled to a bias.

Example 9

The apparatus of example 7 comprises: a third resistive device coupled to a source of the first transconductance component; and a fourth resistive device coupled to a source of the second transconductance component.

Example 10

An apparatus comprising: a first input and a second input; a first transistor and a second transistor component; a first capacitor having a first terminal coupled to the first input and a second terminal coupled to a gate of the first transistor; a first capacitor having a first terminal coupled to the second input and a second terminal coupled to a gate of the second transistor; a third capacitor coupled to the second input and a source of the first transistor; and a second capacitor coupled to the first input and a source of the second transistor.

Example 11

The apparatus of example 10 comprising: a third transistor to receive the first input, wherein the third transistor is coupled in series with the first transistor; and a fourth transistor to receive the second input, wherein the fourth transistor is coupled in series with the second transistor.

Example 12

The apparatus of example 11 comprising a current source, wherein the first input transistor and the second input transistor are coupled to the current source.

Example 13

The apparatus of example 10 comprises: a first resistive device coupled to the gate of the first transistor; and a second resistive device coupled to the gate of the second transistor, wherein the first resistive device is coupled in series with the second resistive device.

Example 14

The apparatus of example 13, wherein the first resistive device and the second resistive device are coupled to a node, wherein the node is coupled to a bias.

Example 15

The apparatus of example 10 comprises: a third resistive device coupled to a source of the first transistor; and a fourth resistive device coupled to a source of the second transistor.

Example 16

A system comprising: a memory; a processor coupled to the memory; and a wireless interface to allow the processor to communicate with another device, wherein the processor comprises a voltage gain amplifier which includes: a first input and a second input; a first transconductance component and a second transconductance component; a first feedforward path where the first input is coupled to a gate of the first transconductance component; a second feedforward path where the second input is coupled to a gate of the second transconductance component; a first capacitor coupled to the second input and a source of the first transconductance component; and a second capacitor coupled to the first input and a source of the second transconductance component.

Example 17

The system of example 16, wherein: the first feedforward path comprises a third capacitor with a first terminal coupled to the gate of the first transconductance component and a second terminal coupled to the first input; and the second feedforward path comprises a fourth capacitor with a first terminal coupled to the gate of the second transconductance component and a second terminal coupled to the second input.

Example 18

The system of example 17, wherein the voltage gain amplifier comprises: a first input transistor to receive the first input, wherein the first input transistor is coupled in series with the first transconductance component; a second input transistor to receive the second input, wherein the second input transistor is coupled in series with the second transconductance component; and a current source, wherein the first input transistor and the second input transistor are coupled to the current source.

Example 19

The system of example 16, wherein the first transconductance component comprises a first n-type transistor, and wherein the second transconductance component comprises a second n-type transistor.

Example 20

The system of example 17, wherein the voltage gain amplifier comprises: a first resistive device coupled to the gate of the first transconductance component; a second resistive device coupled to the gate of the second transconductance component, wherein the first resistive device is coupled in series with the second resistive device, wherein the first resistive device and the second resistive device are coupled to a node, wherein the node is coupled to a bias; and a third resistive device coupled to a source of the first transconductance component; a fourth resistive device coupled to a source of the second transconductance component.

Example 21

An apparatus comprising: a first input and a second input; and an amplifier to receive the first input and the second input, wherein the amplifier feed-forwards the first input to a gate of a first transconductance component and feed-forwards the second input to a gate of the second transconductance component, wherein the amplifier also feed-forwards the first input to a source of the first transconductance component and feed-forwards the second input to a source of the second transconductance component.

Example 22

The apparatus of example 21, wherein the amplifier feed-forwards the first input to a gate of a first transconductance component and feed-forwards the second input to a gate of the second transconductance component such that a unity gain bandwidth is increased by a factor of two.

Example 23

The apparatus of example 22, wherein the amplifier feed-forwards the first input to a source of the first transconductance component and feed-forwards the second input to a source of the second transconductance component such that unity gain bandwidth is further increased to a total increase by a factor of three.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a first input and a second input;
a first transconductance component and a second transconductance component;
a first feedforward path where the first input is coupled to a gate of the first transconductance component;
a second feedforward path where the second input is coupled to a gate of the second transconductance component;
a first capacitor coupled to the second input and a source of the first transconductance component;
a second capacitor coupled to the first input and a source of the second transconductance component;
a first input transistor to receive the first input, wherein the first input transistor is coupled in series with the first transconductance component;
a second input transistor to receive the second input, wherein the second input transistor is coupled in series with the second transconductance component; and
a current source, wherein the first input transistor and the second input transistor are coupled to the current source.

2. The apparatus of claim 1, wherein the first feedforward path comprises a third capacitor with a first terminal coupled to the gate of the first transconductance component and a second terminal coupled to the first input.

3. The apparatus of claim 1, wherein the second feedforward path comprises a fourth capacitor with a first terminal coupled to the gate of the second transconductance component and a second terminal coupled to the second input.

4. The apparatus of claim 1, wherein the first transconductance component comprises a first n-type transistor, and the second transconductance component comprises a second n-type transistor.

5. The apparatus of claim 1, further comprising:
a first resistive device coupled to the gate of the first transconductance component; and
a second resistive device coupled to the gate of the second transconductance component, wherein the first resistive device is coupled in series with the second resistive device.

6. The apparatus of claim 5, wherein the first resistive device and the second resistive device are coupled to a node, and the node is coupled to a bias.

7. The apparatus of claim 5, further comprising:
a third resistive device coupled to the source of the first transconductance component; and a fourth resistive device coupled to the source of the second transconductance component.

8. An apparatus, comprising:
first and second transistors in a first pair of transistors, wherein the first pair of transistors are coupled to a current source;
third and fourth transistors in a second pair of transistors, wherein the first transistor is coupled in series with the third transistor, and the second transistor is coupled in series with the fourth transistor;
a first input coupled to a gate of the first transistor;
a second input coupled to a gate of the second transistor;
a first path to couple the first input to a gate of the third transistor via a first capacitor;
a second path to couple the second input to a gate of the fourth transistor via a second capacitor;
a third input coupled to a source of the third transistor via a third capacitor; and
a fourth input coupled to a source of the fourth transistor via a fourth capacitor;
wherein the first and fourth inputs are coupled to a first voltage signal, and the second and third inputs are coupled to a second voltage signal.

9. An apparatus, comprising:
a first input and a second input;
a first transistor and a second transistor;
a first capacitor having a first terminal coupled to the first input and a second terminal coupled to a gate of the first transistor;
a second capacitor having a first terminal coupled to the second input and a second terminal coupled to a gate of the second transistor;
a third capacitor coupled to the second input and a source of the first transistor;
a fourth capacitor coupled to the first input and a source of the second transistor;
a first resistive device coupled to the gate of the first transistor; and
a second resistive device coupled to the gate of the second transistor, wherein the first resistive device is coupled in series with the second resistive device.

10. The apparatus of claim 9, further comprising:
a third transistor to receive the first input, wherein the third transistor is coupled in series with the first transistor; and
a fourth transistor to receive the second input, wherein the fourth transistor is coupled in series with the second transistor.

11. The apparatus of claim 9, further comprising a current source, wherein the first transistor and the second transistor are coupled to the current source.

12. The apparatus of claim 9, wherein the first resistive device and the second resistive device are coupled to a node, wherein and the node is coupled to a bias.

13. The apparatus of claim 9, further comprising:
a third resistive device coupled to a source of the first transistor; and
a fourth resistive device coupled to a source of the second transistor.

14. The apparatus of claim 8, wherein:
when the first, second, third and fourth capacitors are open circuits, a gain of the first pair of transistors is not boosted by a gain of the second pair of transistors; and
when the first, second, third and fourth capacitors are closed circuits, the gain of the first pair of transistors is boosted by the gain of the second pair of transistors.

15. The apparatus of claim 14, wherein when the first, second, third and fourth capacitors are closed circuits, and a unity gain bandwidth of the apparatus is increased by at least a factor of two.

16. The apparatus of claim 14, wherein:
the first, second, third and fourth capacitors are open circuits when frequencies of the first and second voltage signals are less than cutoff frequencies of the first, second, third and fourth capacitors; and
the first, second, third and fourth capacitors are closed circuits when frequencies of the first and second voltage signals are greater than the cutoff frequencies of the first, second, third and fourth capacitors.

17. The apparatus of claim 8, wherein:
the first and second transistors are p-type metal oxide semiconductor field effect transistors (MOSFETs); and
the third and fourth transistors are n-type MOSFETs.

18. The apparatus of claim 8, further comprising:
a first resistive device coupled to the gate of the third transistor; and
a second resistive device coupled to the gate of the fourth transistor, wherein the first resistive device is coupled in series with the second resistive device.

* * * * *

UNITED STATES PATENT AND TRADEMARK OFFICE
CERTIFICATE OF CORRECTION

| | |
|---|---|
| PATENT NO. | : 11,476,817 B2 |
| APPLICATION NO. | : 17/023192 |
| DATED | : October 18, 2022 |
| INVENTOR(S) | : Saurabh Anmadwar, Dheeraj Shetty and Madhuban Kishor |

It is certified that error appears in the above-identified patent and that said Letters Patent is hereby corrected as shown below:

In the Claims

Column 22
Line 9, "wherein and the…" should read --and the…--

Signed and Sealed this
Twenty-seventh Day of August, 2024

Katherine Kelly Vidal
*Director of the United States Patent and Trademark Office*